United States Patent [19]
Wen et al.

[11] Patent Number: 6,154,066
[45] Date of Patent: Nov. 28, 2000

[54] APPARATUS AND METHOD FOR INTERFACING INTEGRATED CIRCUITS HAVING INCOMPATIBLE I/O SIGNAL LEVELS

[75] Inventors: Roy M. Wen, San Jose; Alan K. Ng, Sunnyvale; Robert R. Griffith, San Jose, all of Calif.

[73] Assignee: Oak Technology, Inc., Sunnyvale, Calif.

[21] Appl. No.: 09/212,743

[22] Filed: Dec. 15, 1998

[51] Int. Cl.[7] .................................................... H03K 5/22
[52] U.S. Cl. ............................................. 327/65; 327/205
[58] Field of Search ................................. 327/51, 63, 65, 327/205

[56] References Cited

U.S. PATENT DOCUMENTS

| | | | |
|---|---|---|---|
| 4,471,235 | 9/1984 | Sakhuja et al. | 327/34 |
| 4,716,322 | 12/1987 | D'Arrigo et al. | 327/143 |
| 5,434,545 | 7/1995 | Burchfield | 327/134 |
| 5,570,052 | 10/1996 | Fonderie et al. | 327/205 |
| 5,642,244 | 6/1997 | Okada et al. | 360/61 |
| 5,982,209 | 11/1999 | Magazzu' et al. | 327/144 |

OTHER PUBLICATIONS

"LVDS Owner's Manual: Moving Info with LVDS", Chapter 1, Introduction to LVDS, pp.1 1–3, Revision 1.0, Spring 1997, National Semiconductor.

"IEEE Standard for a High Performance Serial Bus", Section J.6 Isolation Barrier, pp. 347–348, IEEE Std 1394–1995, Published by the IEEE, New York, NY 10017, dated Aug. 30, 1996, SH94364.

*Primary Examiner*—Terry D. Cunningham
*Attorney, Agent, or Firm*—William S. Galliani; Pennie & Edmonds LLP

[57] ABSTRACT

An apparatus and method for interfacing integrated circuits having incompatible input-output signal offset voltages that is relatively inexpensive and yet is also insensitive to noise. The apparatus of the present invention includes a receiver circuit for receiving differential signals on a differential line, comprising: (1) an interface circuit coupled to the differential signal line for removing a first offset voltage from the differential signal and biasing the differential signal to generate a biased differential signal having a second offset voltage, the interface circuit including a plurality of capacitive devices, (2) a differential amplifier circuit coupled to the interface circuit for converting the biased differential signal into a single-ended signal, (3) a Schmitt trigger circuit coupled to the differential amplifier circuit for filtering the single-ended signal to generate a filtered single-ended signal and (4) a latch circuit coupled to the Schmitt trigger circuit for filtering and asynchronously latching the filtered single-ended signal to generate a sustained, filtered digital signal. The method of the present invention comprises the steps of: (1) capacitively removing a first offset voltage from the differential signal, (2) biasing the differential signal to generate a biased differential signal having a second offset voltage, (3) converting the biased differential signal into a single-ended signal, (4) filtering the single-ended signal using a hysteresis-loop transfer function to generate a filtered single-ended signal and (5) filtering and latching the filtered single-ended signal using a delayed regenerative feedback, hysteresis-loop transfer function to generate a sustained, filtered digital signal.

10 Claims, 5 Drawing Sheets

APPARATUS AND METHOD FOR INTERFACING INTEGRATED CIRCUITS HAVING INCOMPATIBLE I/O SIGNAL LEVELS

BRIEF DESCRIPTION OF THE INVENTION

The present invention relates generally to interfaces for integrated circuits. More particularly, the present invention relates to an apparatus and method for interfacing integrated circuits having incompatible input-output (I/O) signal offset voltages.

BACKGROUND OF THE INVENTION

FIG. 1 is a diagrammatic view of a conventional digital system 100 including a transmitting device 110 and a receiving device 120. The transmitting device 110 includes a driver circuit 112 for outputting a signal generated by the transmitting device 110 onto a signal line 115. In this figure, the signal line 115 contains a single conductor for transmitting a single-ended signal, i.e., a signal representing the voltage difference between the conductor and a ground voltage. Alternatively, the signal line 115 may contain two conductors for transmitting a differential signal, i.e., a signal representing the voltage difference between the two conductors. The receiving device 120 includes a receiver circuit 122 for receiving the signal transmitted across the signal line 115.

The transmitting device 110 and the receiving device 120 are integrated circuits that may have incompatible DC I/O signal levels such that the signals generated by the transmitting device may not be correctly received by the receiving device. Specifically, the transmitting and receiving devices may operate using different offset voltages (i.e., the voltage of the DC component of a signal). To enable such incompatible transmitting and receiving devices to communicate with each other, an interface circuit 130 is connected to the signal line 115 between the devices. The interface circuit 130 removes the offset voltage from the signal output by the transmitting device 110 and biases the signal with a new offset voltage appropriate for the receiving device 120. The interface circuit 130 removes the offset voltage from the signal using either inductive or capacitive AC coupling. An interface circuit using inductive AC coupling includes relatively expensive inductor components. By contrast, an interface circuit using capacitive AC coupling includes capacitor components, which are less expensive than inductor components. However, an interface circuit using capacitive AC coupling is susceptible to data transmission errors caused by electrical noise. Although the electrical noise can be suppressed by shielding the signal line 115, the shielding increases the cost of the system.

In view of the shortcomings of prior art interface circuits, it is an object of the present invention to provide an apparatus and method for interfacing integrated circuits having incompatible I/O signal offset voltages that is relatively inexpensive to implement and yet is also insensitive to noise.

SUMMARY OF THE INVENTION

The present invention is an apparatus and method for interfacing integrated circuits having incompatible input-output signal offset voltages. The apparatus of the present invention includes a receiver circuit for receiving a differential signal on a differential line, comprising: (1) an interface circuit coupled to the differential signal line for removing a first offset voltage from the differential signal and biasing the differential signal to generate a biased differential signal having a second offset voltage, the interface circuit including a plurality of capacitive devices, (2) a differential amplifier circuit coupled to the interface circuit for converting the biased differential signal into a single-ended signal, (3) a Schmitt trigger circuit coupled to the differential amplifier circuit for filtering the single-ended signal to generate a filtered single-ended signal and (4) a latch circuit coupled to the Schmitt trigger circuit for filtering and asynchronously latching the filtered single-ended signal to generate a sustained, filtered digital signal.

The method of the present invention comprises the steps of: (1) capacitively removing a first offset voltage from the differential signal, (2) biasing the differential signal to generate a biased differential signal having a second offset voltage, (3) converting the biased differential signal into a single-ended signal, (4) filtering the single-ended signal using a hysteresis-loop transfer function to generate a filtered single-ended signal and (5) filtering and latching the filtered single-ended signal using a delayed regenerative feedback, hysteresis-loop transfer function to generate a sustained, filtered digital signal.

The receiver circuit of the present invention is insensitive to noise and yet is also relatively inexpensive. The receiver circuit is insensitive to noise present on the transmitted differential signal because it uses the combination of a Schmitt trigger circuit and a latch circuit to filter out the noise. The receiver circuit is relatively inexpensive because it uses capacitive AC coupling to remove the offset voltage from the transmitted differential signal, thereby avoiding the use of expensive inductor components. To further reduce cost, the capacitive devices used to perform the capacitive AC coupling can be fabricated on the same integrated circuit as the rest of the receiver circuit, eliminating the need for discrete components.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
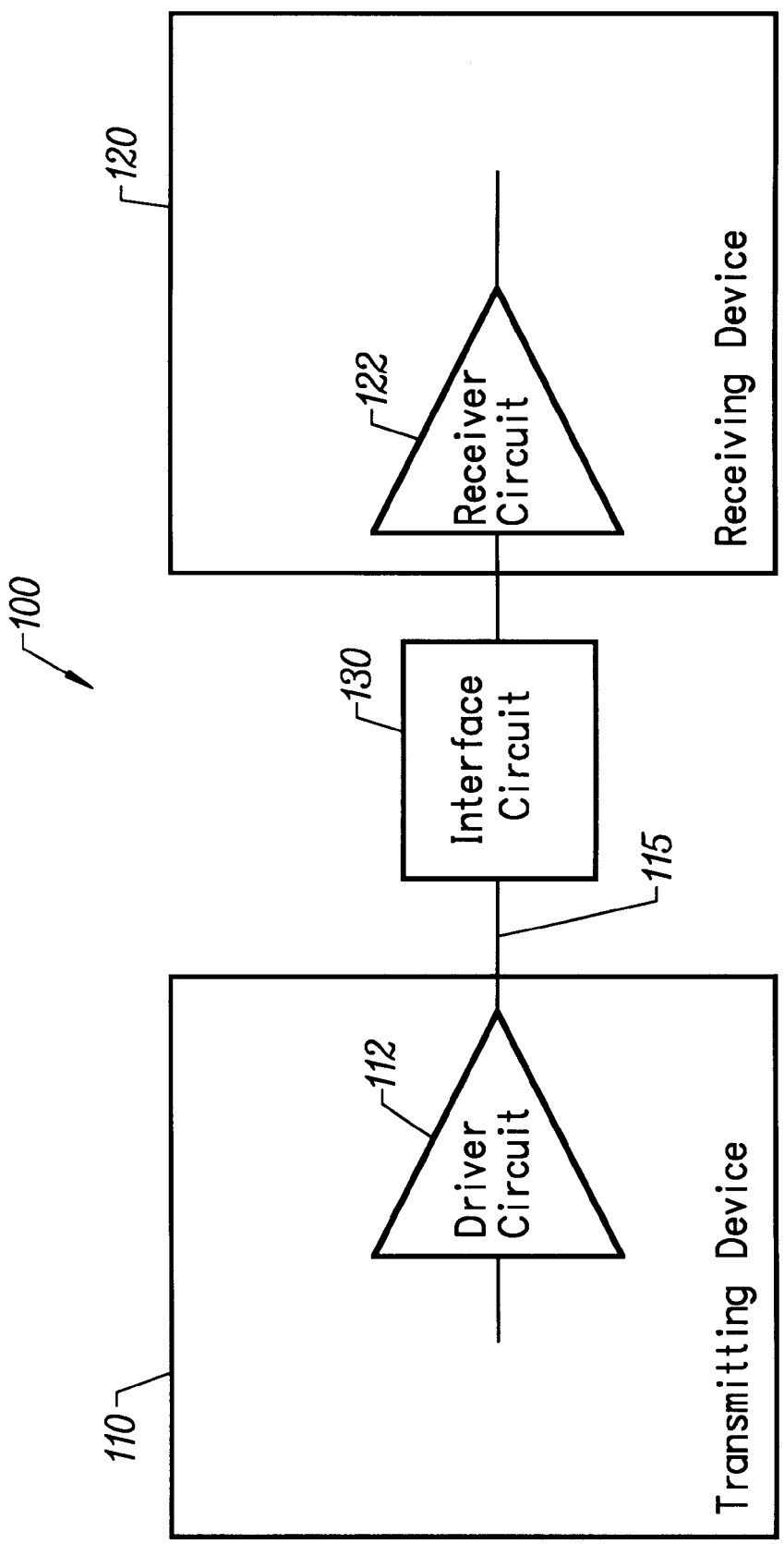
FIG. 1 is a block diagram of a conventional digital system; including a transmitting device, a receiving device and an interface circuit.
Figure 2:
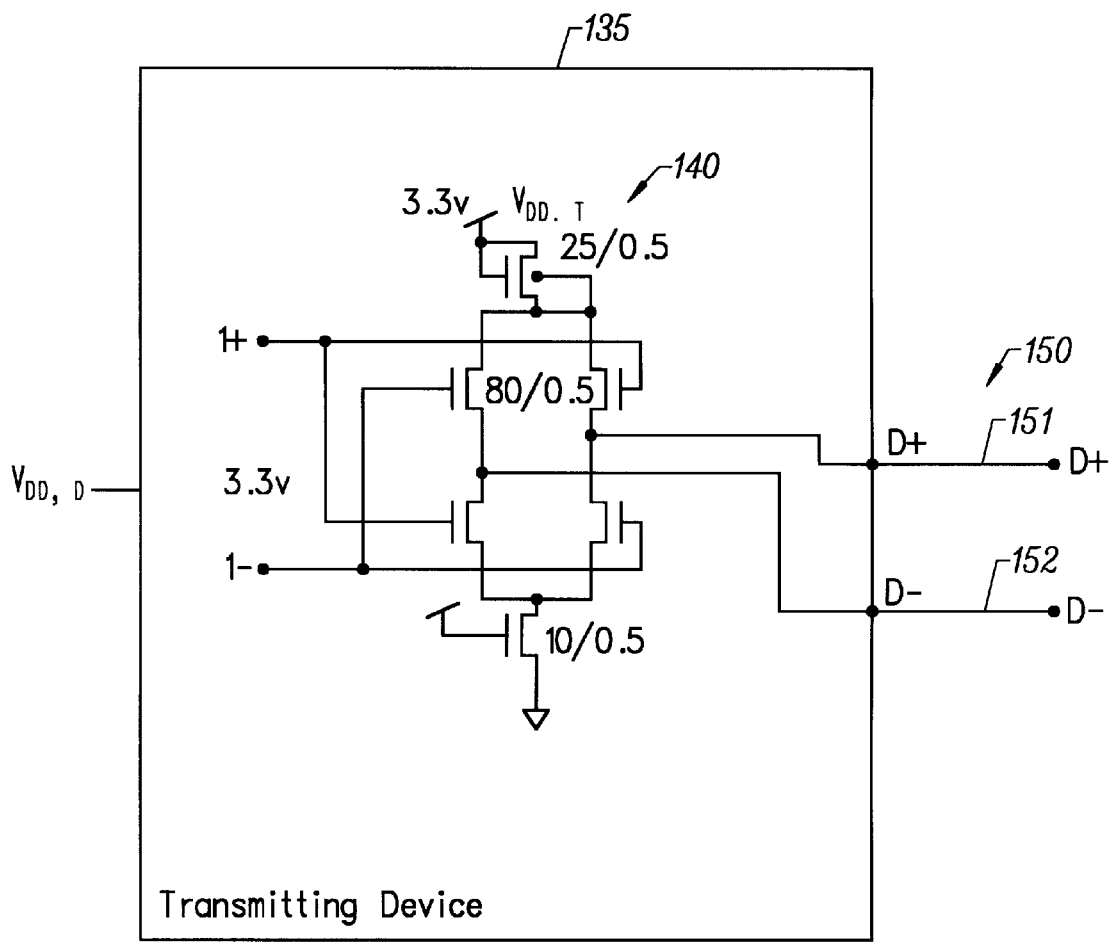
FIG. 2 is a circuit diagram of a driver circuit and a signal line in accordance with the present invention.
Figure 3:
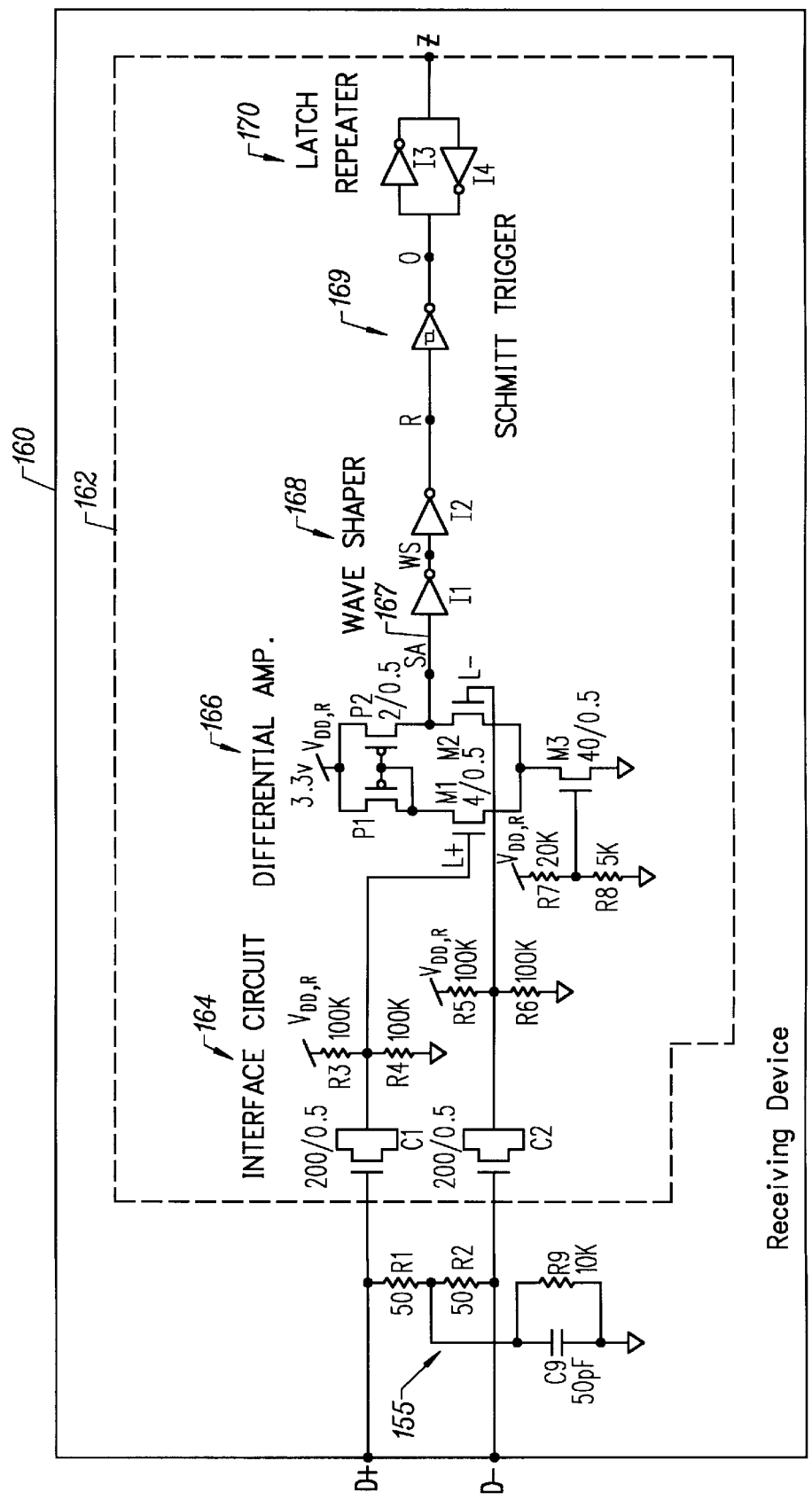
FIG. 3 is a circuit diagram of a termination circuit and a receiver circuit in accordance with the present invention.

FIGS. 2 and 3 show a transmitting device 135, a differential signal line 150 and a receiving device 160 in accordance with an embodiment of the present invention. As described in greater detail below, the receiving device 160 includes a receiver circuit that is insensitive to noise and yet is also relatively inexpensive. The receiver circuit is insensitive to noise present on the transmitted differential signal because it uses the combination of a Schmitt trigger circuit and a latch circuit to filter out the noise. The receiver circuit is relatively inexpensive to implement because it uses capacitive devices to remove the offset voltage from the transmitted differential signal, thereby avoiding the use of expensive inductor components. Furthermore, the capacitive devices can be fabricated on the same integrated circuit as the rest of the receiver circuit, eliminating the need for discrete components.

The transmitting device 135, which may comprise an integrated circuit, is connected to a power supply voltage $V_{DD,T}$. In this embodiment of the transmitting device, the power supply voltage $V_{DD,T}$ is 3.3 V. The transmitting device 135 includes a driver circuit 140 that is used to generate a differential signal D+/D− for transmission across the differential signal line 150. The driver circuit 140 is a differential output driver circuit in a cross-coupled configuration that is known in the art. The driver circuit 140 is connected to the power supply voltage $V_{DD,T}$. The driver circuit 140 includes a differential input I+/I− for receiving a differential signal I+/I−. The driver circuit 140 also includes a differential output D+/D− for generating the differential signal D+/D− for transmission across the differential signal line 150.

Figure 4:
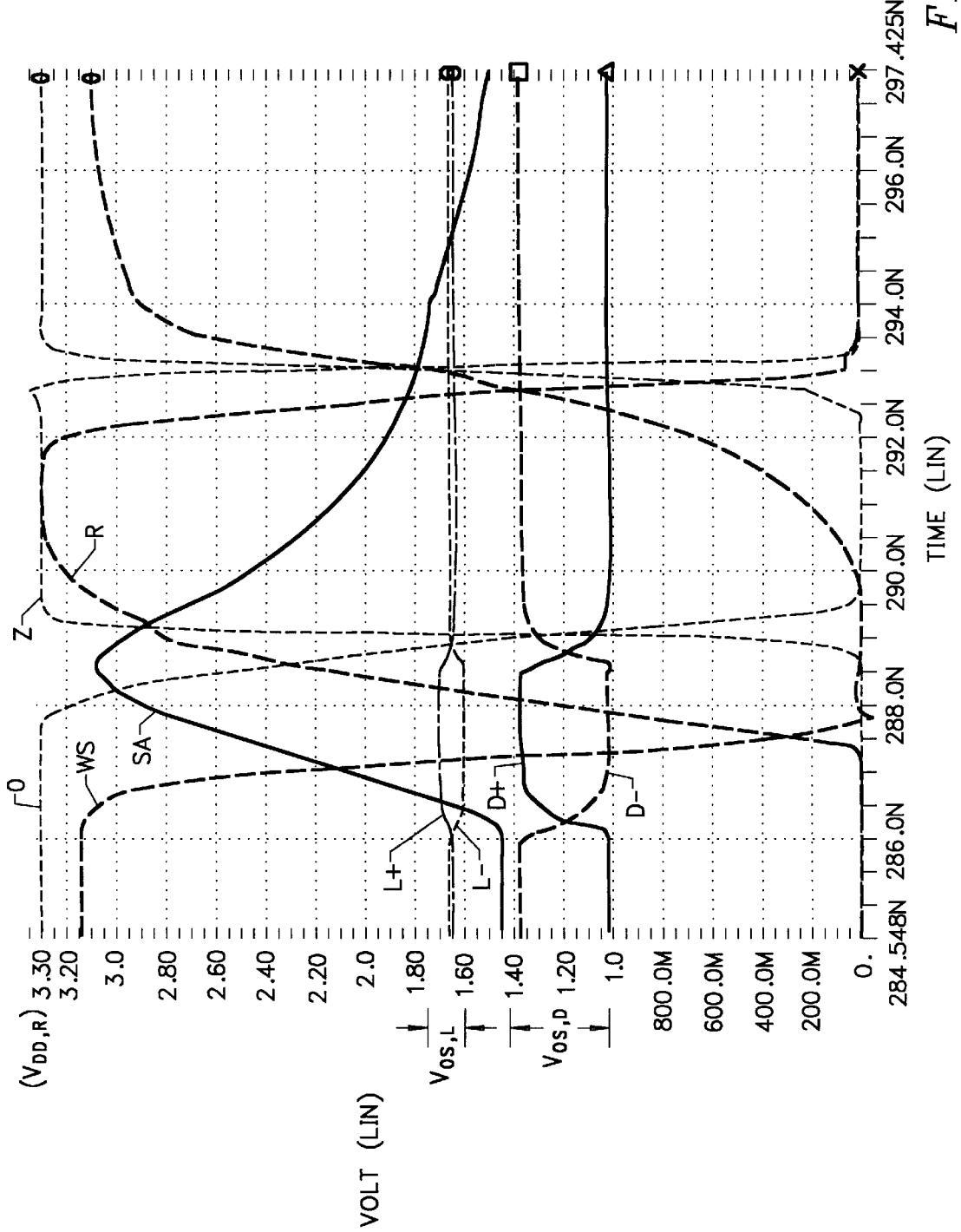
FIG. 4 is a waveform diagram of the signals generated by the receiver circuit shown in FIG. 3.

Referring to FIG. 4, the differential signal D+/D− generated by the driver circuit 140 has an offset voltage $V_{OS,D}$ and a differential output voltage $V_{OD,D}$. The offset voltage $V_{OS,S}$ is the voltage of the DC component of the differential signal D+/D−. The offset voltage $V_{OS,D}$ which is determined by the design of the driver circuit 140, the power supply voltage $V_{DD,T}$ and the fabrication process of the transmitting device 135, may vary widely between different transmitting devices. The differential output voltage $V_{OD,D}$ is the peak-to-peak difference in voltage between the signals D+ and D−. In this embodiment of the transmitting device, the offset voltage $V_{OS,D}$ and the differential output voltage $V_{OD,D}$ are set to voltages within the ranges specified by the ANSI/TIA-644 Low Voltage Differential Signaling (LVDS) standard, specifically: $V_{OS,D}$=1.25 V and $V_{OD,D}$=±350 mV. In other embodiments, the offset voltage $V_{OS,D}$ and the differential output voltage $V_{OD,D}$ may be set to different values.

Referring again to FIG. 2, the differential signal line 150 propagates the differential signal D+/D− generated by the driver circuit 140 to the receiving device 160. The differential signal line 150 includes a pair of conductors 151 and 152, which may be implemented as metallic traces on either a printed circuit board or a flexible plastic substrate.

Referring to FIG. 3, the receiving device 160, which may comprise an integrated circuit, is connected to a power supply voltage $V_{DD,R}$. In this embodiment of the receiving device 160, the power supply voltage $V_{DD,R}$ is the same as the power supply voltage $V_{DD,T}$ of the transmitting device 135, 3.3 V. However, other embodiments of the receiving device may use a power supply voltage $V_{DD,R}$ that is different from the power supply voltage $V_{DD,T}$ of the transmitting device.

The receiving device 160 includes a termination load 155. The termination load 155 is used to prevent reflections from occurring on the differential signal line 150 caused by an impedance mismatch between the driver circuit 140 and the signal line, as is well-known in the art. Alternatively, the termination load 155 may be disposed external to the receiving device 160. The termination load 155 includes two termination resistors R1 and R2 connected between the conductors 151 and 152, respectively, and a differential ground node G. Optionally, a capacitor C9 and a resistor R9 may be connected in parallel between the differential ground node G and a ground supply $V_{SS}$ to reinforce the differential ground signal. The differential ground node G may be connected to the corresponding differential ground nodes of adjacent receiving devices to further reinforce the differential ground.

The receiving device 160 also includes a receiver circuit 162 that is used to amplify and latch the differential signal D+/D− received from the differential signal line 150. The receiver circuit 162 has a differential input D+/D− for receiving the differential signa D+/D− from the differential signal line 150.

The receiver circuit 162 includes an interface circuit 164 connected to the differential input D+/D−. The interface circuit 164 performs two concurrent functions: (1) it capacitively AC couples the receiving device 160 to the differential signal line 150, removing the offset voltage $V_{OS,D}$ from the differential signal D+/D− and (2) it biases the AC coupled differential signal by an offset voltage $V_{OS,L}$ to generate a new biased differential signal L+/L−. The offset voltage $V_{OS,L}$ is the voltage of the DC component of the biased differential signal L+/L−. The interface circuit 164 includes two capacitive devices C1 and C2 connected to the differential input D+/D− for performing the capacitive AC coupling function. In this embodiment of the present invention, the capacitive devices C1 and C2 each comprise a 200/0.5 μm (W/L) NMOS transistor in a 0.35 μm CMOS process with the source and drain tied together, providing a capacitance of about 0.5 pF.

The interface circuit 164 also includes four resistors R3, R4, R5 and R6 connected to the capacitive devices C1 and C2 for performing the DC biasing function. The resistors R3 and R4 are used to bias the signal L+ by the offset voltage $V_{OS,L}$. The resistor R3 is connected between the power supply voltage $V_{DD,R}$ and a node transmitting the signal L+ while the resistor R4 is connected between the node transmitting the signal L+ and a ground supply. Similarly, the resistors R5 and R6 are used to bias the signal L− by the same offset voltage $V_{OS,L}$. The resistor R5 is connected between the power supply voltage $V_{DD,R}$ and a node transmitting the signal L− while the resistor R6 is connected between the node transmitting the signal L− and the ground supply. The values of the resistors R3, R4, R5 and R6 are selected to provide the biased differential signal L+/L− with an offset voltage $V_{OS,L}$ appropriate for the receiving device 160, as explained below. In this embodiment of the invention, the resistors R3, R4, R5 and R6 each have a resistance of about 100 KΩ.

As just described, the interface circuit 164 is composed solely of resistors and transistors. Since resistors and transistors can be made using integrated circuit fabrication techniques, the interface circuit can be fabricated with the rest of the receiver circuit 162 on a single integrated circuit. Separate components are not required to build the interface circuit, thereby reducing the cost and size of the digital system containing the receiver circuit.

Referring to FIG. 4, the offset voltage $V_{OS,L}$ of the biased differential signal L+/L− generated by the interface circuit 164 is shown. Typically, the offset voltage $V_{OS,L}$ is set to a value that mize the gain of the differential amplifier 166 receiving the biased differential signal L+/L−. This value depends on the design of the differential amplifier circuit, the power supply voltage $V_{DD,R}$ and the fabrication process of the receiving device 160 and may vary widely between different receiving devices. As a result, the offset voltage $V_{OS,L}$ required by the receiving device 160 may be different from the offset voltage $V_{OS,D}$ of the differential signal D+/D− generated by the transmitting device 135, thus necessitating the use of the interface circuit 164. In this embodiment of the receiver circuit 162, the biased differential signal L+/L− has an offset voltage $V_{OS,L}$ of about 1.65 V, which differs from the 1.25 V offset voltage $V_{OS,D}$ of the differential signal D+/D−.

The biased differential signal L+/L− also provides a differential output voltage $V_{OD,L}$. The differential output voltage $V_{OD,L}$ is the peak-to-peak difference in voltage between the signals L+/L−. In this embodiment of the receiver circuit 162, the biased differential signal L+/L− has a differential output voltage $V_{OD,L}$ of about ±40 mV.

Referring back to FIG. 3, the receiver circuit 162 further includes a differential amplifier circuit 166 connected to the interface circuit 164. The differential amplifier circuit 166 amplifies and converts the biased differential signal L+/L− to generate a single-ended signal SA on line 167. As shown in FIG. 4, the single-ended signal SA has a relatively slow rise and fall time and, furthermore, has a voltage swing that does not reach either 0 V or $V_{DD,R}$. The differential amplifier circuit 166 is a differential amplifier driver in a conventional configuration that is well-known in the art. The differential amplifier circuit 166 includes the series-connected p-channel transistor P1 and n-channel transistor M1 connected in parallel with the series-connected p-channel transistor P2 and n-channel transistor M2. The differential amplifier circuit 166 also includes an n-channel transistor M3 connected between the series-parallel transistor structure and the ground supply $V_{SS}$. The differential amplifier circuit 166 further includes resistors R7 and RS connected to the gate of the n-channel transistor M3 to bias the transistor such that it acts as a current source. In this embodiment of the present invention, the p-channel transistors P1 and P2 each comprise a 2/0.5 μm (W/L) PMOS transistor, the n-channel transistors M1 and M2 each comprise a 4/0.5 μm (W/L) NMOS transistor, the n-channel transistor M3 comprises a 40/0.5 μm (W/L) NMOS transistor, the resistor R7 has a resistance of 20 kΩ and the resistor R8 has a resistance of 5 kΩ.

The receiver circuit 162 additionally includes a wave shaper circuit 168 connected to the output of the differential amplifier 166. The wave shaper circuit 168 consists of two inverters 11 and 12 with appropriately set switch points that are connected in series, a configuration that is well-known in the art. As shown in FIG. 4, the wave shaper circuit 168 generates a reshaped single-ended signal R that follows the transitions of the single-ended signal SA but has a faster rise time and fall time and, furthermore, has a voltage swing that reaches 0 V and $V_{DD,R}$.

The receiver circuit 162 further includes a Schmitt trigger circuit 169 connected to the output of the wave shaper circuit 168. The Schmitt trigger circuit 169 filters out noise that may be present in the reshaped single-ended signal R to generate a filtered single-ended signal O, as shown in FIG. 4. The noise in the signal R originates from differential (i.e., non-common mode) noise present in the differential signal D+/D−. The Schmitt trigger circuit 169 provides a hysteresis-loop transfer function such that whenever the input signal crosses the trigger voltage $V_{T1}$ or $V_{T2}$ (depending on the direction the input signal is transitioning), the output signal toggles between 0 V and $V_{DD,r}$. Specifically, whenever the reshaped single-ended signal R crosses the first trigger voltage $V_{T1}$ when transitioning from 0 V to $V_{DD,R}$, the output of the Schmitt trigger circuit 169 toggles from $V_{DD,R}$ to 0 V. Also, whenever the signal R crosses the second trigger voltage $V_{T2}$ when transitioning from $V_{DD,R}$ to 0 V, the output of the Schmitt trigger circuit 169 toggles from 0 V to $V_{DD,R}$. As a result, the Schmitt trigger circuit 169 does not transmit noise pulses present in the reshaped single-ended signal R having amplitudes less than the trigger voltage $V_{T1}$ or $V_{T2}$. In this embodiment of the receiver circuit 162, the first and second trigger voltages $V_{T1}$ and $V_{T2}$ are about 30 percent and 70 percent, respectively, of the power supply voltage $V_{DD,R}$. The Schmitt trigger circuit 169 is a circuit that is well-known in the art and may be constructed using any conventional technique.

Finally, the receiver circuit 162 includes a latch circuit 170 connected to the output of the Schmitt trigger circuit 169. The latch circuit 170 filters out any noise remaining in the filtered single-ended signal O and asynchronously latches the signal to generate a filtered, sustained digital signal Z, as shown in FIG. 4. The latch circuit 170 filters and latches the single-ended signal O using a delayed regenerative feedback, hysteresis-loop transfer function. The latch circuit 170 is a circuit that is well-known in the art and may be constructed using any conventional technique. In this embodiment of the receiver circuit 162, the latch circuit 170 consists of the inverters 13 and 14 arranged in a cross-coupled configuration. The delayed regenerative feedback is provided by the inverter I4.

Figure 5:
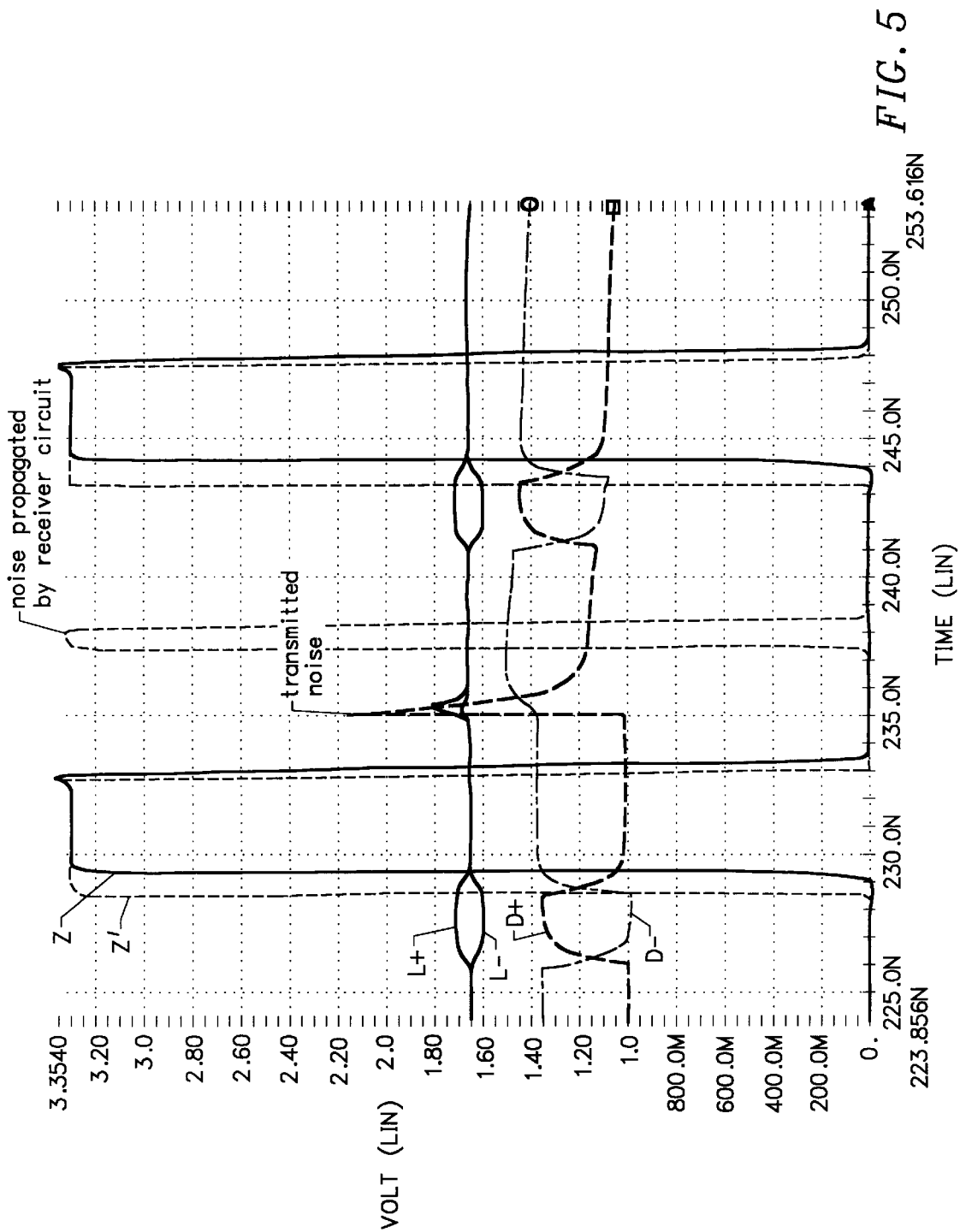
FIG. 5 is a waveform diagram of the signals generated by the receiver circuit shown in FIG. 3 in the presence of a noisy input differential signal, illustrating the effect of the Schmitt trigger circuit and latch circuit in filtering out the noise.

FIG. 5 is a waveform diagram of the signals generated by the receiver circuit 162 in the presence of a noisy differential signal D+/D−, illustrating the effect of the Schmitt trigger circuit 169 and the latch circuit 170 in filtering out the noise. As seen in the figure, the differential signal D+/D− received by the receiver circuit 162 has a differential (i.e., non-common mode) noise pulse present in the signal. However, the receiver circuit 162 filters out the noise pulse so that it is not transmitted to the output, as shown by the output signal Z. By contrast, if the Schmitt trigger circuit 169 and latch circuit 170 are replaced by a CMOS buffer, the receiver circuit does not filter out the noise pulse so that it is transmitted to the output, as indicated by the output signal Z'.

In summary, the receiver circuit of the present invention is insensitive to noise and yet is also relatively inexpensive. The receiver circuit is insensitive to noise present on the transmitted differential signal because it uses the combination of a Schmitt trigger circuit and a latch circuit to filter out the noise. The receiver circuit is relatively inexpensive to implement because it uses capacitive devices to remove the offset voltage from the transmitted differential signal, thereby avoiding the use of expensive inductor components. To further reduce cost, the capacitive devices can be fabricated on the same integrated circuit as the rest of the receiver circuit, eliminating the need for discrete components.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A receiver circuit for receiving a differential signal on a differential signal line, comprising:
    an interface circuit coupled to said differential signal line to remove a first offset voltage from said differential signal and to bias said differential signal to generate a biased differential signal having a second offset voltage, said interface circuit including a plurality of capacitive devices;
    a differential amplifier circuit coupled to said interface circuit to convert said biased differential signal into a single-ended signal;
    a Schmitt trigger circuit coupled to said differential amplifier circuit to filter said single-ended signal to generate a filtered single-ended signal; and
    a latch circuit coupled to said Schmitt trigger circuit to filter and asynchronously latch said filtered single-ended signal to generate a sustained, filtered digital signal.

2. The receiver circuit of claim 1, wherein said interface circuit, said differential amplifier circuit, said Schmitt trigger circuit and said latch circuit are disposed on a single semiconducting substrate.

3. The receiver circuit of claim 1, wherein said Schmitt trigger further includes:
    a first trigger voltage for use when said single-ended signal transitions from a digital low state to a digital high state; and
    a second trigger voltage for use when said single-ended signal transitions from said digital high state to said digital low state.

4. The receiver circuit of claim 3, wherein:
    said first trigger voltage is about 30 percent of the voltage of said digital high state; and
    said second trigger voltage is about 70 percent of the voltage of said digital high state.

5. The receiver circuit of claim 1, further comprising:
    a wave shaper circuit coupled between said differential amplifier circuit and said Schmitt trigger circuit to generate a reshaped single-ended signal with a faster transition time than said single-ended signal.

6. A system for transmitting and receiving differential signals, comprising:
    a transmitting device including a driver circuit to generate a differential signal having a first offset voltage;
    a differential signal line coupled to said transmitting device to propagate said differential signal; and
    a receiving device coupled to said differentials signal line to receive said differential signal, including:
        an interface circuit coupled to said differential signal line to remove a first offset voltage from said differential signal and to bias said differential signal to generate a biased differential signal having a second offset voltage, said interface circuit including a plurality of capacitive devices;
        a differential amplifier circuit coupled to said interface circuit to convert said biased differential signal into a single-ended signal;
        a Schmitt trigger circuit coupled to said differential amplifier circuit to filter said single-ended signal to generate a filtered single-ended signal; and
        a latch circuit coupled to said Schmitt trigger circuit to filter and asynchronously latch said filtered single-ended signal to generate a sustained, filtered digital signal.

7. The system of claim 6, wherein said receiving device further includes a termination load coupled between said differential signal line and said interface circuit, said termination load including a differential ground node coupled to a second differential ground node of a second termination load of a second receiving device.

8. The system of claim 6, wherein said interface circuit, said differential amplifier circuit, said Schmitt trigger circuit and said latch circuit are disposed on a single semiconducting substrate.

9. A method for receiving a differential signal, comprising the steps of:
    capacitively removing a first offset voltage from said differential signal;
    biasing said differential signal to generate a biased differential signal having a second offset voltage;
    converting said biased differential signal into a single-ended signal;
    filtering said single-ended signal using a hysteresis-loop transfer function to generate a filtered single-ended signal; and
    filtering and latching said filtered single-ended signal using a delayed regenerative feedback, hysteresis-loop transfer function to generate a sustained, filtered digital signal.

10. The method of claim 9, further comprising the step of:
    between said converting step and said filtering step, accelerating the transition time of said single-ended signal.

* * * * *